United States Patent
Levy et al.

(10) Patent No.: US 8,690,455 B2
(45) Date of Patent: Apr. 8, 2014

(54) PLANAR OPTICAL INTERFACE AND SPLITTER

(75) Inventors: Shmuel Levy, Kiryat Tivon (IL); Shai Rephaeli, Kiryat Tivon (IL); Nimer Khazen, Ba'ne Village (IL); Yonatan Malkiman, Kfar Yehezkel (IL)

(73) Assignee: Mellanox Technologies Ltd., Yokneam (IL)

( * ) Notice: Subject to any disclaimer, the term of this patent is extended or adjusted under 35 U.S.C. 154(b) by 0 days.

(21) Appl. No.: 13/532,829

(22) Filed: Jun. 26, 2012

(65) Prior Publication Data

US 2013/0294780 A1    Nov. 7, 2013

Related U.S. Application Data

(60) Provisional application No. 61/643,305, filed on May 6, 2012.

(51) Int. Cl.
  *G02B 6/38* (2006.01)
  *G02B 6/43* (2006.01)

(52) U.S. Cl.
  USPC .................................. 385/60; 385/59; 385/89

(58) Field of Classification Search
  USPC ............................................... 385/59, 60, 89
  See application file for complete search history.

(56) References Cited

U.S. PATENT DOCUMENTS

| | | |
|---|---|---|
| 4,130,343 A | 12/1978 | Miller et al. |
| 4,337,759 A | 7/1982 | Popovich et al. |
| 5,073,003 A | 12/1991 | Clark |
| 5,404,869 A | 4/1995 | Parkyn, Jr. et al. |
| 6,132,107 A | 10/2000 | Morikawa |
| 6,456,766 B1 | 9/2002 | Shaw et al. |
| 6,491,447 B2 | 12/2002 | Aihara |
| 6,567,574 B1 * | 5/2003 | Ma et al. .................. 385/16 |
| 6,635,866 B2 | 10/2003 | Chan et al. |
| 6,721,187 B2 | 4/2004 | Hall et al. |
| 7,040,814 B2 * | 5/2006 | Morimoto et al. ............. 385/88 |
| 7,049,704 B2 | 5/2006 | Chakravorty et al. |
| 7,289,701 B2 | 10/2007 | Lam et al. |
| 7,515,415 B2 | 4/2009 | Monfarad et al. |
| 7,538,358 B2 | 5/2009 | Badehi et al. |
| 7,665,911 B2 * | 2/2010 | Hamazaki .................... 385/93 |
| 8,043,877 B2 | 10/2011 | Badehi et al. |
| 8,115,302 B2 | 2/2012 | Andry et al. |

(Continued)

OTHER PUBLICATIONS

Lagziel et al., U.S. Appl. No. 13/851,178, filed Mar. 27, 2012.

(Continued)

*Primary Examiner* — Omar Rojas
(74) *Attorney, Agent, or Firm* — D. Kligler IP Services Ltd.

(57) ABSTRACT

An apparatus includes an optical Input/Output (I/O) connector, which has a central axis that is mounted in a plane and which is configured to connect to external optical fibers for transferring input optical signals to the apparatus and output optical signals from the apparatus. A first optical ferrule is mounted perpendicularly to the optical I/O connector in the plane, and is configured to transfer the input optical signals from the optical I/O connector to respective optical detectors. A second optical ferrule is mounted perpendicularly to the optical I/O connector in the plane, and is configured to transfer the output optical signals from respective optical emitters to the optical connector. A light rotation module is configured to bend and transfer the input and output optical signals between the optical I/O connector and the perpendicularly-mounted first and second optical ferrules.

21 Claims, 4 Drawing Sheets

(56) References Cited

U.S. PATENT DOCUMENTS

| | | |
|---|---|---|
| 8,315,287 B1 | 11/2012 | Roggero et al. |
| 2006/0008214 A1 | 1/2006 | Giboney et al. |
| 2012/0051685 A1 | 3/2012 | Su et al. |
| 2012/0224814 A1 | 9/2012 | Hirano et al. |
| 2013/0156386 A1* | 6/2013 | Miller .............................. 385/93 |

OTHER PUBLICATIONS

Levy et al., U.S. Appl. No. 13/677,374, filed Nov. 15, 2012.
Levy et al., U.S. Appl. No. 13/731,025, filed Dec. 30, 2012.
Stockham et al., "Assembly of micro-optical systems with mechanical positioning", Proceedings of the SPIE, Optomechatronic Micro/Nano Devices and Components II, 637609, Oct. 13, 2006.
U.S. Appl. No. 13/366,326, filed Feb. 5, 2012.
U.S. Appl. No. 13/419,447, filed Mar. 14, 2012.
U.S. Appl. No. 13/419,449, filed Mar. 14, 2012.
U.S. Appl. No. 13/481,874, filed May 28, 2012.
U.S. Appl. No. 13/369,324, filed Feb. 9, 2012.
Connected Fibers, LLC., "MT Ferrules", Datasheet, Jan. 2009.
Lee et al., "Silicon Optical Bench for Transmitter Module", Department of Optics and Photonics, National Central University, Taiwan, Oct. 19, 2009.
"Glass and Silicon Packages Webinar", Georgia Institute of Technology, 3D-Systems Packaging Research Center, Atlanta, USA, Jul. 21, 2010.
Micralyne, Inc., "MEMS Optical Components", Apr. 5, 2012.
Eldada et al., "Advances in Polymer Integrated Optics", IEEE Journal of Selected Topics in Quantum Electronics, vol. 5, No. 1, pp. 54-68, Jan./Feb. 2000.
International Electrotechnical Commision, "Fiber Optic Connector Interfaces—Part 5: Type MT Connector Family", IEC document No. IEC61754-5, second edition, 32 pages, Jul. 2005.
U.S. Appl. No. 13/366,326 Office Action dated Oct. 25, 2013.
U.S. Appl. No. 13/369,324 Office Action dated Nov. 4, 2013.

* cited by examiner

ND SPLITTER

PLANAR OPTICAL INTERFACE AND SPLITTER

CROSS-REFERENCE TO RELATED APPLICATIONS

This application claims the benefit of U.S. Provisional Patent Application 61/643,305, filed May 6, 2012, whose disclosure is incorporated herein by reference.

FIELD OF THE INVENTION

The present invention relates generally to optical communication devices, and particularly to optical interface modules.

BACKGROUND OF THE INVENTION

Optical interface modules are used in communication equipment for converting optical signals into electrical signals and vice versa. Some optical interface modules comprise components such as Photo-Detectors (PDs) and Trans-Impedance Amplifiers (TIAs) for optical reception, drivers and Vertical Cavity Surface-Emitting Lasers (VCSELs) for optical transmission, high-speed electrical connectors, as well as light coupling optics for coupling light to and from optical fibers that are connected to the optical interface module.

SUMMARY OF THE INVENTION

An embodiment of the present invention that is described herein includes an apparatus that includes an optical Input/Output (I/O) connector, first and second optical ferrules and a light rotation module. The optical I/O connector has a central axis that is mounted in a plane. The connector is configured to connect to external optical fibers for transferring input optical signals to the apparatus and output optical signals from the apparatus. The first optical ferrule is mounted perpendicularly to the optical I/O connector in the plane, and is configured to transfer the input optical signals from the optical I/O connector to respective optical detectors. The second optical ferrule is mounted perpendicularly to the optical I/O connector in the plane, and is configured to transfer the output optical signals from respective optical emitters to the optical connector. The light rotation module is configured to bend and transfer the input and output optical signals between the optical I/O connector and the perpendicularly-mounted first and second optical ferrules.

In some embodiments, the light rotation module includes first and second sets of optical fibers that are bent at right angles and are configured to carry the input and output optical signals between the optical I/O connector and the first and second optical ferrules, respectively. In a disclosed embodiment, the light rotation module includes first and second arrays of mirrors that are configured to rotate the input and output optical signals at right angles between the optical I/O connector and the first and second optical ferrules, respectively. In an embodiment, the first optical ferrule includes an array of lenses for focusing the input optical signals onto the respective optical detectors.

In some embodiments, the apparatus includes a U-shaped Printed Circuit Board (PCB), which is formed so as to have first and second parallel faces, such that the optical detectors are mounted on the first face opposite the first optical ferrule and the optical emitters are mounted on the second face opposite the second optical ferrule. The U-shaped PCB may include electrical interconnections, which are mounted on a third face of the PCB that is perpendicular to the first and second faces, for outputting first electrical signals produced by the optical detectors and for inputting second electrical signals for driving the optical emitters. The apparatus may further include amplifiers for amplifying the first electrical signals produced by the optical detectors, and drivers for driving the optical emitters with the second electrical signals, wherein the amplifiers and the drivers are mounted on the U-shaped PCB.

In other embodiments, the optical I/O connector includes first and second rows of optical terminals, which are arranged one above the other parallel with the plane for transferring the input and output optical signals, respectively. In an embodiment, the light rotation module includes first and second sub-modules, which are arranged one above the other in the plane opposite the respective first and second rows of the optical I/O connector, for bending and transferring the input and output optical signals, respectively.

In an alternative embodiment, the optical I/O connector includes first and second columns of optical terminals, which are arranged one beside the other perpendicularly to the plane for transferring the input and output optical signals, respectively. In another embodiment, the optical I/O connector includes a Multi-Termination-24 (MT-24) connector, and each of the first and second optical ferrules conforms to an MT-12 specification.

There is additionally provided, in accordance with an embodiment of the present invention, a method for producing an optical interface module. The method includes mounting an optical I/O connector, such that a central axis of the I/O connector is mounted in a plane, for connecting to external optical fibers that transfer input optical signals to the optical interface module and output optical signals from the optical interface module. A first optical ferrule is mounted perpendicularly to the optical I/O connector in the plane, for transferring the input optical signals from the optical I/O connector to respective optical detectors. A second optical ferrule is mounted perpendicularly to the optical I/O connector in the plane, for transferring the output optical signals from respective optical emitters to the optical connector. The optical I/O connector is connected to the first and second optical ferrules by a light rotation module, which bends and transfers the input and output optical signals between the optical I/O connector and the perpendicularly-mounted first and second optical ferrules.

There is also provided, in accordance with an embodiment of the present invention, a method for communication including transferring input optical signals to an optical interface module and output optical signals from the optical interface module using an optical I/O connector that has a central axis mounted in a plane. The input optical signals are transferred from the optical I/O connector to respective optical detectors using a first optical ferrule that is mounted perpendicularly to the optical I/O connector in the plane. The output optical signals are transferred from respective optical emitters to the optical connector using a second optical ferrule that is mounted perpendicularly to the optical I/O connector in the plane. The input and output optical signals are bent and transferred between the optical I/O connector and the perpendicularly-mounted first and second optical ferrules using a light rotation module.

The present invention will be more fully understood from the following detailed description of the embodiments thereof, taken together with the drawings in which:

DETAILED DESCRIPTION OF EMBODIMENTS

Overview

Figure 1:
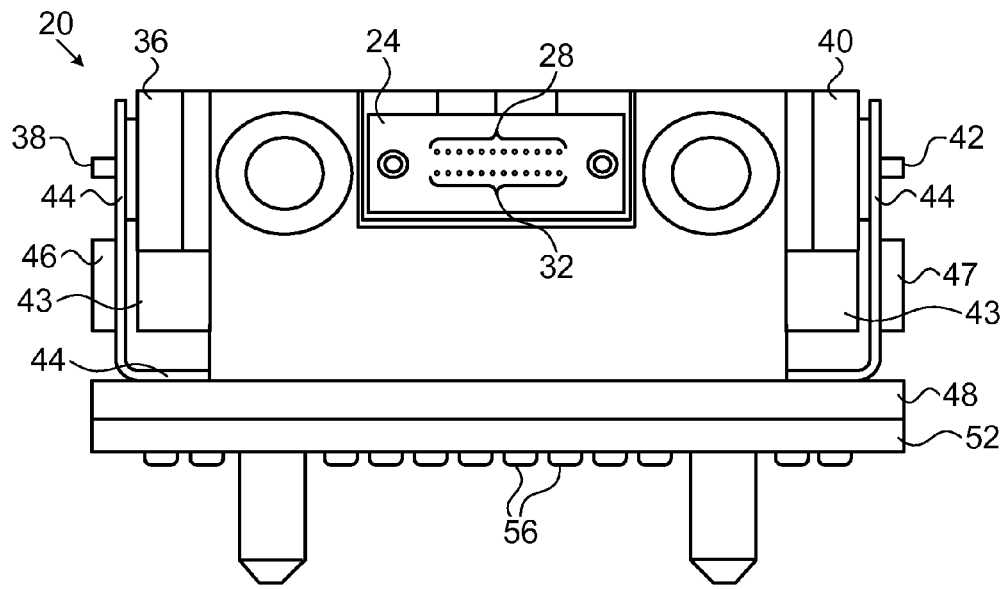
FIG. 1 is a diagram showing a front view of an optical interface module, in accordance with an embodiment of the present invention.

Embodiments of the present invention that are described hereinbelow provide improved optical interface module configurations. The disclosed modules exchange signals between optical fibers at one end and electronic equipment at the other end. Modules of this sort can be used, for example, for interconnection between network switches, servers and storage devices. The disclosed modules are typically designed for mounting on a main Printed Circuit Board (PCB) of the electronic equipment.

In some embodiments, an optical interface module comprises an optical Input/Output (I/O) connector for receiving optical input signals and for transmitting optical output signals. The connector may comprise, for example, an MT-24 female ferrule connector for coupling to an optical fiber cable with a male MT-24 connector.

The optical interface module comprises two optical ferrules. One ferrule transfers the optical input signals from the I/O connector to an array of optical detectors for conversion into electrical signals. The other ferrule transfers the optical output signals from an array of optical emitters to the I/O connector for transmission.

In some embodiments, the I/O connector and the two ferrules are all arranged in a flat, planar configuration, i.e., in the same plane. The I/O connector comprises two rows of optical terminals, positioned one above the other parallel with the plane. The ferrules are placed in this plane back-to-back, and perpendicularly to the I/O connector. In alternative embodiments, the central axis of the I/O connector is mounted in the plane, and the connector comprises two columns of optical terminals, positioned one beside the other perpendicularly to the plane.

A light rotation module bends and transfers the input and output optical signals between the optical I/O connector and the perpendicularly-mounted optical ferrules. In some embodiments, the light rotation module comprises Bend-Insensitive (BI) optical fibers that are bent at a right angle and carry the optical signals between the I/O connector and the ferrules. In other embodiments, the light rotation module comprises an array of mirrors that rotate the optical signals at a right angle so as to direct them between the I/O connector and the ferrules.

In some embodiments, the optical detectors (e.g., Photo-Detectors—PDs) and the optical emitters (e.g., Vertical Cavity Surface-Emitting Lasers—VCSELs) are mounted on opposite parallel faces of a U-shaped PCB. Trans-Impedance Amplifiers (TIAs) for amplifying the PD outputs are mounted on the U-shaped PCB adjacent to the PDs, and drivers for driving the VCSELs are mounted on the U-shaped PCB adjacent to the VCSELs. Conductive traces connect the PDs and VCSELs via the TIAs and drivers to electrical interconnections on the third, bottom face of the U-shaped PCB. This third face is used for electrically interconnecting with the electronic equipment.

The disclosed optical interface modules can be used for transmitting and receiving various kinds of optical signals, such as Fourteen Data Rate (FDR) at 14 Gbps and Enhanced Data Rate (EDR) at 25 Gbps. In some embodiments, for example in some EDR implementations, an array of lenses is coupled to the first ferrule in order to focus the light carrying the input optical signals onto the respective optical detectors.

The optical interface modules described herein enable high-speed interconnection between electronic equipment, with an extremely small form factor and low power consumption. In an example embodiment, a module that supports twelve input signals and twelve output signals is 12.5 mm high and occupies a PCB area of 400 mm$^2$. High bandwidth is ensured by placing the drivers and TIAs immediately adjacent to the VCSELs and PDs, respectively.

Optical Interface Module Description

Figure 2:
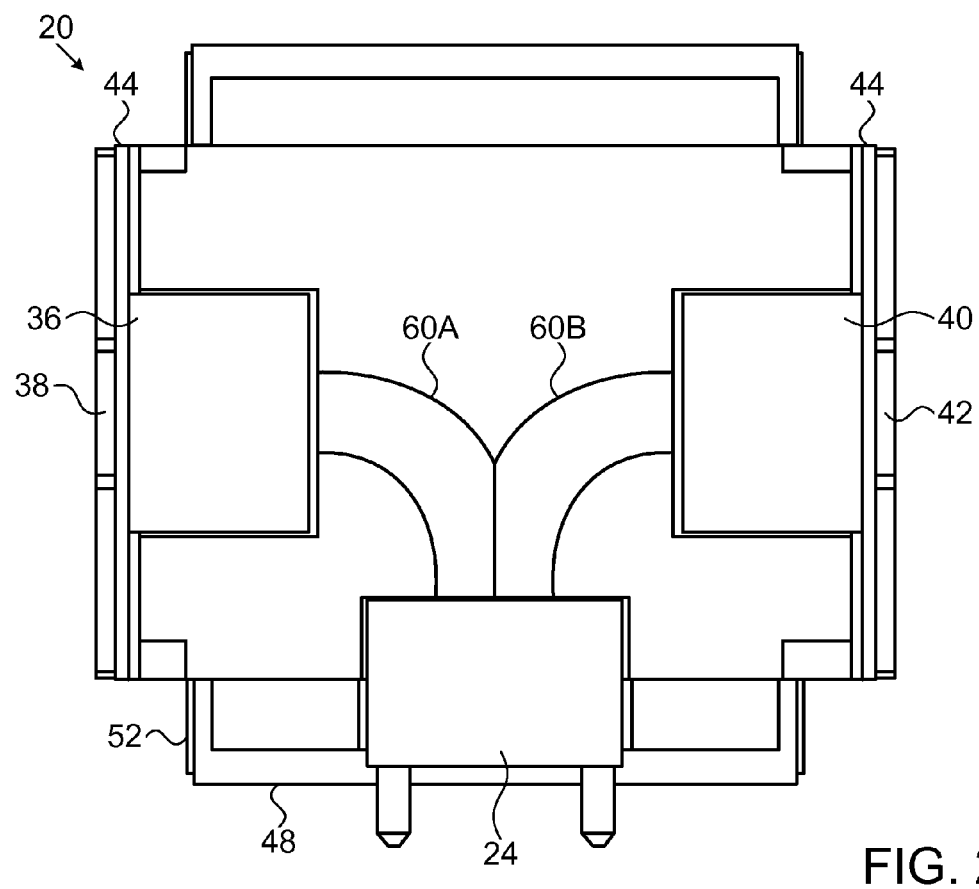
FIG. 2 is a diagram showing a top view of an optical interface module, in accordance with an embodiment of the present invention.

FIG. 1 is a diagram showing a front view of an optical interface module 20, in accordance with an embodiment of the present invention. A top view of module 20 is shown in FIG. 2 below. Module 20 is typically mounted on a main PCB of some electronic equipment, such as a network switch, and used for connecting the switch to other equipment via an optical fiber cable. In the present example, the area of module 20 is 24×16.5 mm, and the module height is 12.5 mm. In alternative embodiments, however, any other suitable dimensions can be used.

Module 20 comprises an optical I/O connector 24, for receiving one or more optical input signals into module 20 and for transmitting one or more optical output signals out of module 20. In the present example, connector 24 comprises a Multi-Termination-24 (MT-24) facet female ferrule. This type of connector comprises two rows of twelve optical terminals each, for connecting to respective optical fibers. In the present example, a top row 28 of terminals is used for transmitting twelve optical output signals and a bottom row 32 is used for receiving twelve optical input signals. In alternative embodiments, however, the optical I/O connector may have any other suitable shape and may support any other suitable number of optical input and output signals.

Module 20 comprises two optical ferrules, typically made of a suitable plastic material. A ferrule 36 is used for coupling an array of VCSELs 38 to respective optical fibers. These fibers carry the optical output signals from VCSELs 38 to row 28 of connector 24. Another ferrule 40 is used for coupling an array of PDs 42 to respective optical fibers. These fibers carry the optical input signals from row 32 of connector 24 to PDs 42. The two ferrules are sometimes referred to as a left-side micro-hole (LSμH) array ferrule and a right-side micro-hole (LSμH) array ferrule. Each ferrule comprises an array of twelve micro-holes for coupling twelve fibers to the respective VCSELs or PDs.

A support beam 43 provides mechanical support for connector 24, ferrules 36 and 40, and the interconnections between them (shown in FIG. 2 below).

Module 20 comprises a U-shaped Printed Circuit Board (PCB) 44. The U-shaped PCB may be produced, for example, from a single flexible PCB that is bent into shape, or from three rigid PCBs that are connected to one another. VCSELs 38 and PDs 42 are mounted on opposite parallel faces of PCB 44. An array of drivers 46 is mounted on PCB 44 adjacent to VCSELs 38. Each driver 46 drives a respective VCSEL 38 with a respective electrical signal, so as to cause the VCSEL to produce an optical output signal. An array of Trans-Impedance Amplifiers (TIAs) 47 is mounted on PCB 44 adjacent to PDs 42. Each TIA 47 amplifies the electrical signal that is produced by a respective PD 42 in response to a respective optical input signal.

The third (bottom) face of U-shaped PCB 44 is attached to a rigid substrate 48, which is in turn attached to a socket 52. Socket 52 comprises multiple electrical interconnections 56, e.g., ball bumps or pins, for connecting to the main PCB of the electronic equipment (not shown in the figure).

FIG. 2 is a diagram showing a top view of optical interface module 20, in accordance with an embodiment of the present invention. In addition to the above-described elements, the top view shows two sets of Bend-Insensitive (BI) optical fibers that are used for transferring the optical signals between optical I/O connector 24 and ferrules 36 and 40.

A set 60A of BI fibers is bent at a right angle so as to transfer the optical output signals produced by VCSELs 38 from ferrule 36 to connector 24. A set 60B of BI fibers is bent at a right angle so as to transfer the optical input signals from connector 24 to ferrule 40, en-route to PDs 42.

As can be seen in FIGS. 1 and 2, all the optical processing in module 20 is performed in a single plane. I/O connector 24, ferrules 36 and 40, VCSELs 38 and PDs 42 are all arranged in a planar configuration in a single plane. The central axis of I/O connector 24, which is parallel to the connector's optical terminals, is located in the plane. The optical terminals are arranged in two rows that are positioned one above the other parallel to the plane. This planar configuration enables module 20 to have a flat shape and a small form factor. In this single plane, ferrules 36 and 40 are positioned back-to-back, and both ferrules are perpendicular to the I/O connector.

Figure 6:
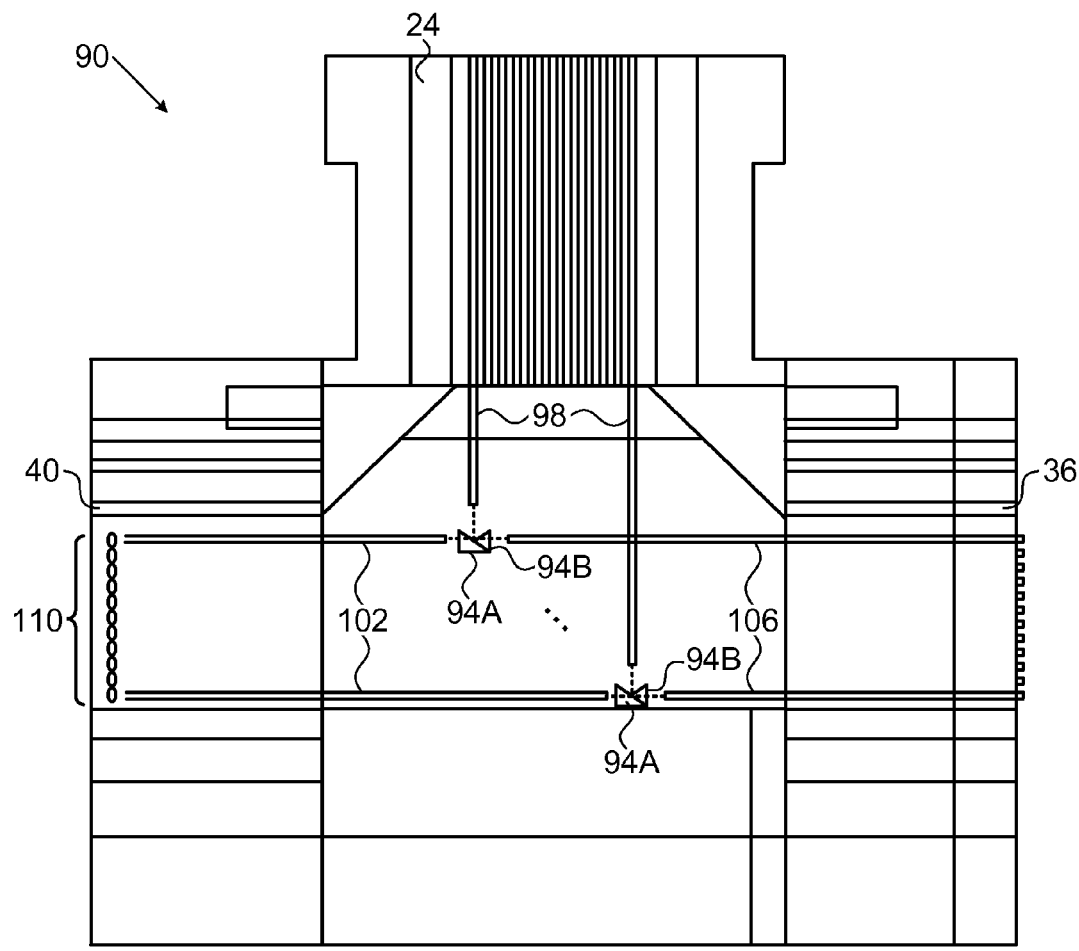
FIG. 6 is a diagram that schematically illustrates a top view of an optical interface module, in accordance with an alternative embodiment of the present invention.

Thus, each fiber set 60A and 60B bends the optical signals at a right angle in order to transfer the optical signals between I/O connector 24 and the respective ferrule. Fiber sets 60A and 60B are one possible implementation of a light rotation module that performs these functions. An alternative implementation using an array of mirrors is shown in FIG. 6 further below. Further alternatively, the light rotation module may be implemented in any other suitable way, for example using prisms.

Figure 3:
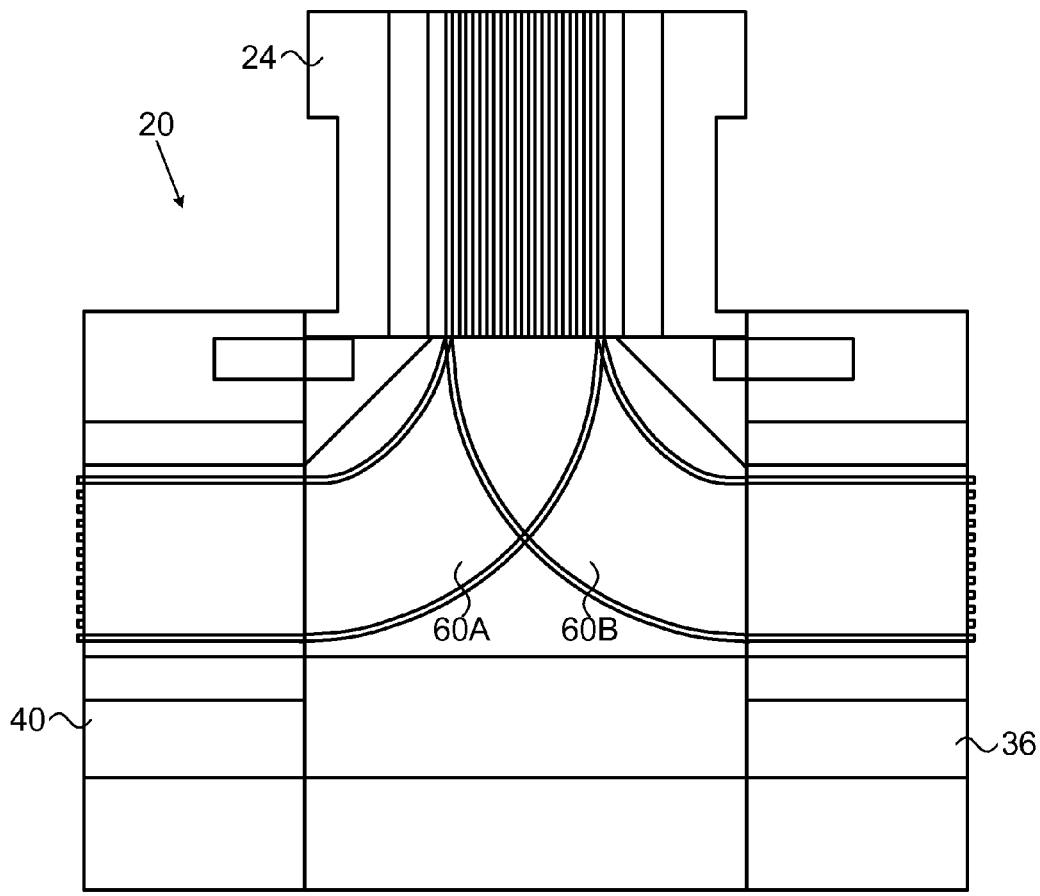
FIG. 3 is a diagram that schematically illustrates a top view of an optical interface module, in accordance with an embodiment of the present invention.

FIG. 3 is a diagram that schematically illustrates a top view of optical interface module 20, in accordance with an embodiment of the present invention. In the present example, the radius of curvature of the BI fibers is 2.5 mm, although any other suitable radius can be used. The fibers may comprise, for example, 50 μm fibers, 125 μm fibers, or any other suitable type of optical fibers.

In the examples of FIGS. 1-3, fiber sets 60A and 60B are coupled to the respective VCSELs and PDs using direct air-gap, butt fiber coupling. This type of coupling is typically used in FDR applications. In alternative embodiments, for example in EDR applications, coupling between fiber set 60B and PDs 42 uses an array of micro-lenses. This sort of configuration is shown in FIG. 6 further below.

Figure 4:
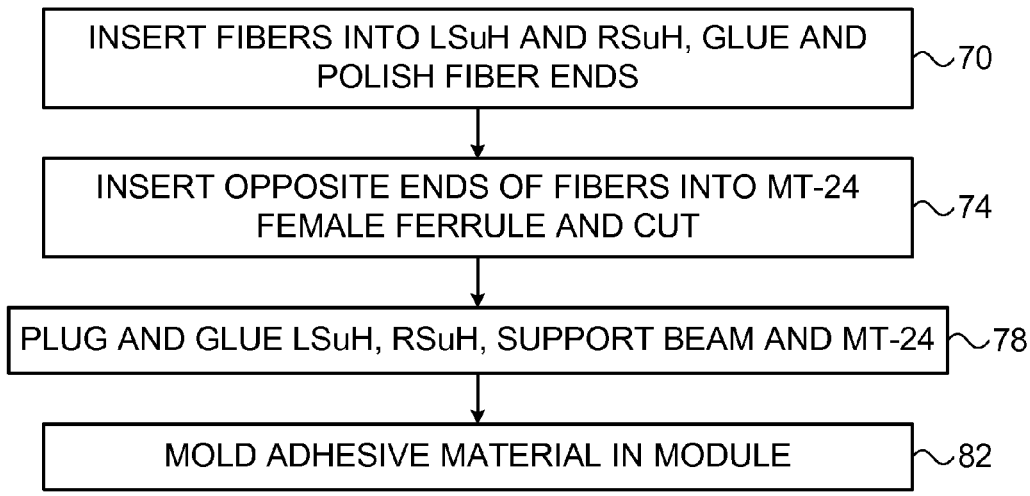
FIG. 4 is a flow chart that schematically illustrates a method for assembling an optical interface module, in accordance with an embodiment of the present invention.

FIG. 4 is a flow chart that schematically illustrates a method for assembling optical interface module 20, in accordance with an embodiment of the present invention. The assembly process of FIG. 4 refers to an FDR implementation using BI fibers. Variations to the process for other implementations are addressed further below.

The method begins by inserting the fibers of sets 60A and 60B into ferrules 36 and 40, respectively, at a ferrule assembly step 70. Twelve fibers are inserted into the micro-holes of each ferrule, until the fibers protrude from the opposite end of the ferrule. The fibers are glued in place, and the protruded ends of the fibers are polished so as to conically shape each fiber end. The far ends of the fibers are left as pigtails.

The far ends of the fibers in sets 60A and 60B (twenty-four in total) are inserted into the appropriate terminals of MT-24 connector 24, at a connector assembly step 74. The fiber ends are cut to the MT-24 facet size.

Connector 24, ferrules 36 and 40, and support beam 43 are fitted and glued together, at an assembly step 78. In some embodiments, the various elements comprise pins and corresponding holes or recesses for this purpose. A soft adhesive material is molded in the opening at the center of the resulting module, at a molding step 82.

Following this assembly process, the remaining elements of module 20, e.g., U-shaped PCB 44 and the components mounted on it, are attached to the ferrules.

In an alternative embodiment, ferrule 40 comprises an internal array of twelve micro-lenses that are fitted against the respective micro-holes. Each lens focuses the light coming out of the respective fiber onto the surface of the respective PD. This implementation, which is shown in FIG. 6 below, is used, for example, in applications where the diameter of the active area of PD 42 is too small for direct coupling between the fiber and the PD. In some EDR applications, for example, the PD active area diameter is smaller than 50 μm, and lenses are thus used for coupling.

When using the array of micro-lenses, the assembly process of FIG. 4 may change: Twelve cleaved fibers are inserted into each ferrule. In ferrule 40, each fiber is inserted until reaching a built-in stopper located before the respective micro-lens facet. The remaining assembly steps proceed according to FIG. 4.

Figure 5A:
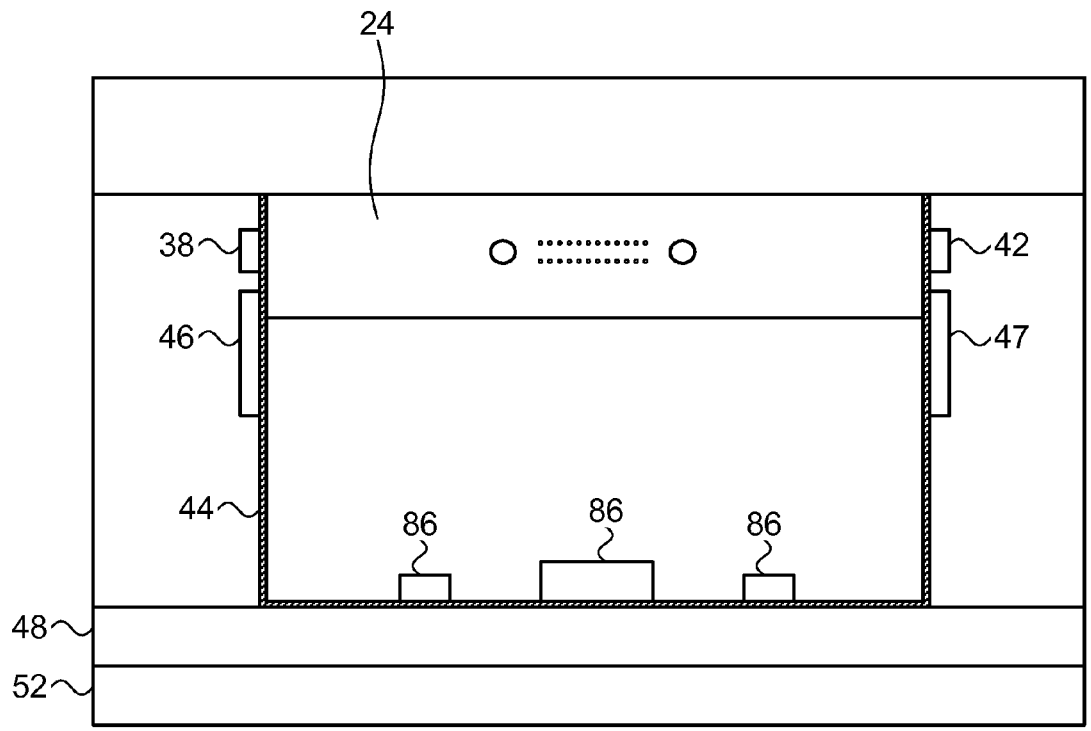
FIGS. 5A and 5B are diagrams that schematically illustrate respective front and top views of an optical interface module, in accordance with an embodiment of the present invention.
Figure 5B:
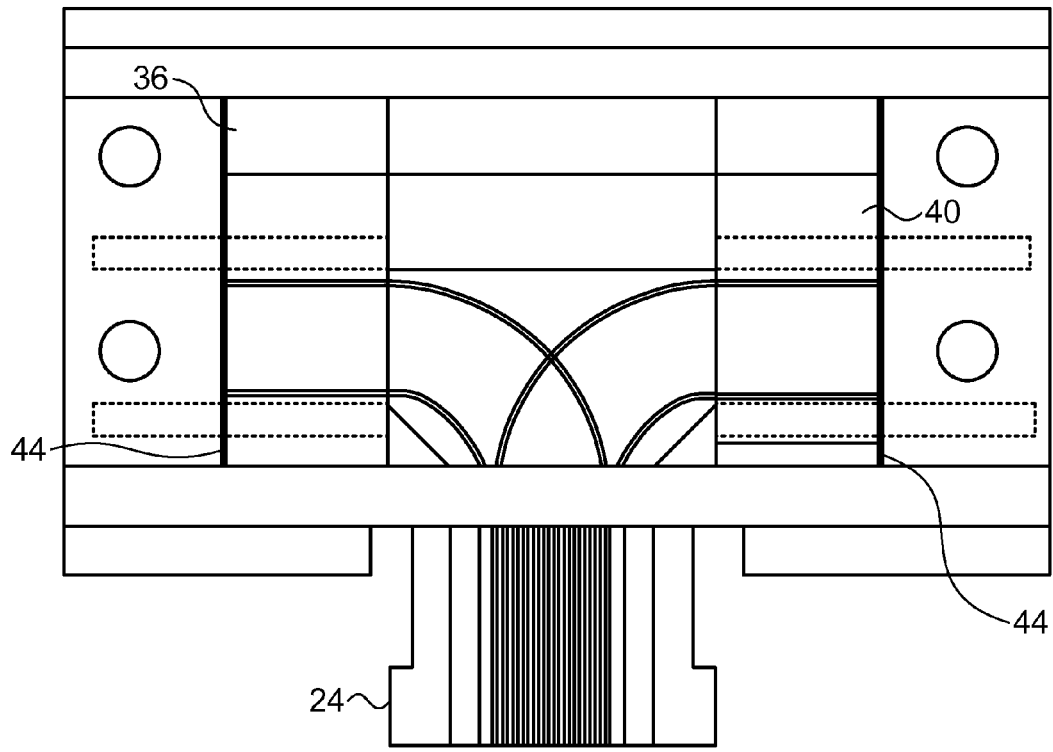

FIGS. 5A and 5B are diagrams that schematically illustrate respective front and top views of optical interface module 20, in accordance with an embodiment of the present invention. These figure show additional elements that may be comprised in the module. In this example, an optical heat block is attached to each of the parallel faces of U-shaped PCB 44. A heat sink is placed on top of the module, above the plane of the ferrules and connector. The heat blocks and heat sink are used for dissipating the heat generated in the module. Additional electronic components 86, such as a microcontroller, may be mounted on the third, bottom face of U-shaped PCB 44.

Alternative Implementation Using Mirror Array

FIG. 6 is a diagram that schematically illustrates a top view of an optical interface module 90, in accordance with an alternative embodiment of the present invention. In this example, the light that carries the optical signals between connector 24 and ferrules 36 and 40 is bent at right angles using an array of micro-mirrors. In this array, twelve mirrors 94A direct the light from VCSELs 38 to connector 24, and twelve mirrors 94B direct the light from connector 24 to PDs 42.

In an embodiment, optical fibers 98 guide the light between connector 24 and the micro-mirror array, optical fibers 102 guide the light between mirrors 94B and ferrule 40, and optical fibers 106 guide the light between mirrors 94A and ferrule 36.

In the implementation of FIG. 6, a micro-lens array 110 in ferrule 40 focuses the light guided by fibers 102 onto the corresponding PDs 42 (not shown in this figure), as explained above.

Figure 7:
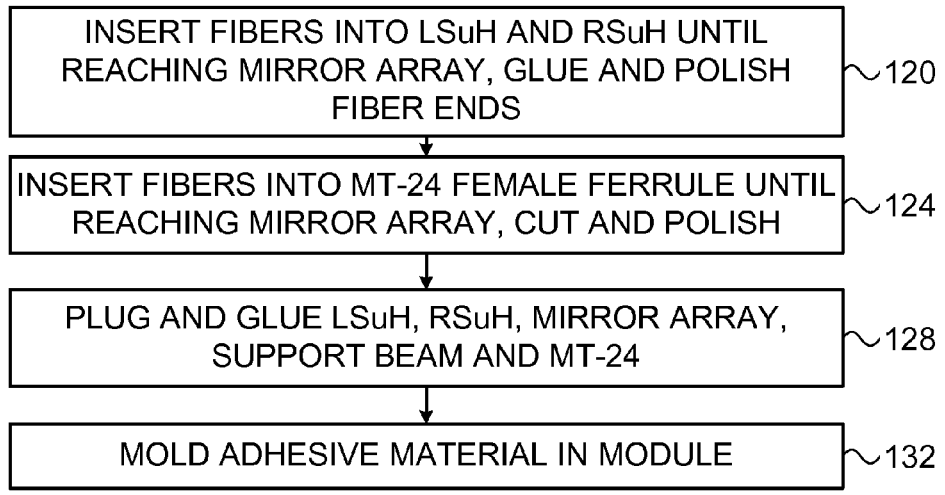
FIG. 7 is a flow chart that schematically illustrates a method for assembling an optical interface module, in accordance with an embodiment of the present invention.

FIG. 7 is a flow chart that schematically illustrates a method for assembling optical interface module 90, in accordance with an embodiment of the present invention. The assembly process begins by inserting twelve fibers 102 and twelve fibers 106 into ferrules 40 and 36, respectively, at a first insertion step 120.

Each fiber is typically inserted until it reaches a built-in stopper located before the respective mirror. At the other end, the fibers are inserted until they protrude from the ferrule, and then glued and polished so as to conically shape each fiber end.

At a second insertion step, twenty-four fibers 98 are inserted into MT-24 connector 24 until each fiber reaches a built-in stopper located before the respective mirror in the mirror array. On the connector side, the fibers are cut and polished to the MT-24 facet plane. At a module assembly step 128, ferrules 36 and 40, support beam 43 and connector 24 are fitted together, e.g., using matching pins and holes, and then glued. Soft adhesive material is molded into the opening at the center of the module, at a potting step 132.

The assembly process of FIG. 7 refers to an FDR module, in which no lens array is used in ferrule 40. For EDR, the process may change: Twelve cleaved fibers are inserted into each ferrule. In ferrule 40, each fiber 102 is inserted until reaching a built-in stopper located before the respective micro-lens facet. The remaining assembly steps proceed according to FIG. 7.

The examples above refer to specific combinations of direct air-gap fiber-end coupling, micro-lens array coupling, light bending using BI fibers and light bending using micro-mirrors. In alternative embodiments, the optical interface module may comprise any other suitable combination of these elements.

The optical interface module configurations described herein are example configurations, which are chosen purely for the sake of conceptual clarity. In alternative embodiments, any other suitable module configuration may be used.

Alternative Implementation Using Rotated I/O Connector

In the embodiments described above, I/O connector 24 is mounted parallel with the plane of module 20, such that the optical terminals of the I/O connector are arranged in two rows that are positioned one above the other parallel with the plane.

In an alternative embodiment, I/O connector 24 is mounted such that the central axis of the connector is in the plane, but the optical terminals are arranged in two columns that are positioned one beside the other perpendicularly to the plane.

In other words, the I/O connector in this alternative embodiment is rotated at 90 degrees relative to its orientation in FIG. 1 above. In a front view similar to that of FIG. 1, the I/O connector in the alternative embodiment would appear vertical, with two columns 28 and 32 of optical terminals arranged vertically one next to the other. In a top view similar to that of FIG. 2 above, the two guide pins of the I/O connector would overlap. In this embodiments, the other elements of the optical module, e.g., the light rotation module and the two ferrules, are modified accordingly to bend the light between the optical terminals of connector 24 and the corresponding PDs and VCSELs.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. Apparatus, comprising:
    an optical Input/Output (I/O) connector, which has a central axis that is mounted in a plane and which is configured to connect to external optical fibers for transferring input optical signals to the apparatus and output optical signals from the apparatus;
    a first optical ferrule, which is mounted perpendicularly to the optical I/O connector in the plane, and is configured to transfer the input optical signals from the optical I/O connector to respective optical detectors;
    a second optical ferrule, which is mounted perpendicularly to the optical I/O connector in the plane, and is configured to transfer the output optical signals from respective optical emitters to the optical connector;
    a light rotation module, which is configured to bend and transfer the input and output optical signals between the optical I/O connector and the perpendicularly-mounted first and second optical ferrules; and
    a U-shaped Printed Circuit Board (PCB), which is formed so as to have first and second parallel faces, such that the optical detectors are mounted on the first face opposite the first optical ferrule and the optical emitters are mounted on the second face opposite the second optical ferrule.

2. The apparatus according to claim 1, wherein the light rotation module comprises first and second sets of optical fibers that are bent at right angles and are configured to carry the input and output optical signals between the optical I/O connector and the first and second optical ferrules, respectively.

3. The apparatus according to claim 1, wherein the light rotation module comprises first and second arrays of mirrors that are configured to rotate the input and output optical signals at right angles between the optical I/O connector and the first and second optical ferrules, respectively.

4. The apparatus according to claim 1, wherein the first optical ferrule comprises an array of lenses for focusing the input optical signals onto the respective optical detectors.

5. The apparatus according to claim 1, wherein the U-shaped PCB comprises electrical interconnections, which are mounted on a third face of the PCB that is perpendicular to the first and second faces, for outputting first electrical signals produced by the optical detectors and for inputting second electrical signals for driving the optical emitters.

6. The apparatus according to claim 5, and comprising amplifiers for amplifying the first electrical signals produced by the optical detectors, and drivers for driving the optical emitters with the second electrical signals, wherein the amplifiers and the drivers are mounted on the U-shaped PCB.

7. The apparatus according to claim 1, wherein the optical I/O connector comprises first and second rows of optical terminals, which are arranged one above the other parallel with the plane for transferring the input and output optical signals, respectively.

8. The apparatus according to claim 7, wherein the light rotation module comprises first and second sub-modules, which are arranged one above the other in the plane opposite the respective first and second rows of the optical I/O connector, for bending and transferring the input and output optical signals, respectively.

9. The apparatus according to claim 1, wherein the optical I/O connector comprises first and second columns of optical terminals, which are arranged one beside the other perpendicularly to the plane for transferring the input and output optical signals, respectively.

10. The apparatus according to claim 1, wherein the optical I/O connector comprises a Multi-Termination-24 (MT-24) connector, and wherein each of the first and second optical ferrules conforms to an MT-12 specification.

11. A method for producing an optical interface module, the method comprising:
mounting an optical Input/Output (I/O) connector, such that a central axis of the I/O connector is mounted in a plane, for connecting to external optical fibers that transfer input optical signals to the optical interface module and output optical signals from the optical interface module;
mounting a first optical ferrule perpendicularly to the optical I/O connector in the plane, for transferring the input optical signals from the optical I/O connector to respective optical detectors;
mounting a second optical ferrule perpendicularly to the optical I/O connector in the plane, for transferring the output optical signals from respective optical emitters to the optical connector;
connecting the optical I/O connector to the first and second optical ferrules by a light rotation module, which bends and transfers the input and output optical signals between the optical I/O connector and the perpendicularly-mounted first and second optical ferrules; and
forming a U-shaped Printed Circuit Board (PCB) so as to have first and second parallel faces, mounting the optical detectors on the first face opposite the first optical ferrule and mounting the optical emitters on the second face opposite the second optical ferrule.

12. The method according to claim 11, wherein the light rotation module comprises first and second sets of optical fibers that are bent at right angles for carrying the input and output optical signals between the optical I/O connector and the first and second optical ferrules, respectively.

13. The method according to claim 11, wherein the light rotation module comprises first and second arrays of mirrors for rotating the input and output optical signals at right angles between the optical I/O connector and the first and second optical ferrules, respectively.

14. The method according to claim 11, and comprising coupling an array of lenses to the first optical ferrule for focusing the input optical signals onto the respective optical detectors.

15. The method according to claim 11, wherein forming the U-shaped PCB comprises mounting electrical interconnections on a third face of the U-shaped PCB that is perpendicular to the first and second faces, for outputting first electrical signals produced by the optical detectors and for inputting second electrical signals for driving the optical emitters.

16. The method according to claim 15, and comprising mounting on the U-shaped PCB amplifiers for amplifying the first electrical signals produced by the optical detectors, and drivers for driving the optical emitters with the second electrical signals.

17. The method according to claim 11, wherein the optical I/O connector comprises first and second rows of optical terminals, which are arranged one above the other parallel with the plane for transferring the input and output optical signals, respectively.

18. The method according to claim 17, wherein the light rotation module comprises first and second sub-modules, which are arranged one above the other in the plane opposite the respective first and second rows of the optical I/O connector, for bending and transferring the input and output optical signals, respectively.

19. The method according to claim 11, wherein the optical I/O connector comprises first and second columns of optical terminals, which are arranged one beside the other perpendicularly to the plane for transferring the input and output optical signals, respectively.

20. The method according to claim 11, wherein the optical I/O connector comprises a Multi-Termination-24 (MT-24) connector, and wherein each of the first and second optical ferrules conforms to an MT-12 specification.

21. A method for communication, comprising:
transferring input optical signals to an optical interface module and output optical signals from the optical interface module using an optical Input/Output (I/O) connector that has a central axis mounted in a plane;
transferring the input optical signals from the optical I/O connector to respective optical detectors using a first optical ferrule that is mounted perpendicularly to the optical I/O connector in the plane;
transferring the output optical signals from respective optical emitters to the optical connector using a second optical ferrule that is mounted perpendicularly to the optical I/O connector in the plane; and
bending and transferring the input and output optical signals between the optical I/O connector and the perpendicularly-mounted first and second optical ferrules using a light rotation module,
wherein the optical detectors and the optical detectors are mounted on a U-shaped Printed Circuit Board (PCB) having first and second parallel faces, such that the optical detectors are mounted on the first face opposite the first optical ferrule and the optical emitters are mounted on the second face opposite the second optical ferrule.

* * * * *